United States Patent
Coutinho et al.

(10) Patent No.: US 9,385,681 B2
(45) Date of Patent: Jul. 5, 2016

(54) BIAS NETWORK

(75) Inventors: Paul Coutinho, Markt Schwaben (DE); Peter Babel, Munich (DE)

(73) Assignee: EPCOS AG, Munich (DE)

( * ) Notice: Subject to any disclaimer, the term of this patent is extended or adjusted under 35 U.S.C. 154(b) by 874 days.

(21) Appl. No.: 12/545,378

(22) Filed: Aug. 21, 2009

(65) Prior Publication Data

US 2010/0056085 A1  Mar. 4, 2010

(30) Foreign Application Priority Data

Aug. 28, 2008  (DE) .......... 10 2008 044 845

(51) Int. Cl.
H04B 1/04 (2006.01)
H03H 7/01 (2006.01)

(52) U.S. Cl.
CPC .................. H03H 7/0115 (2013.01)

(58) Field of Classification Search
CPC ...... H03H 7/38; H03H 7/0115; H03H 7/0123
USPC ........ 455/424, 425, 456.5, 456.6, 561, 550.1, 455/575.1, 113, 277.1, 553.1, 572, 127, 1; 330/311, 295, 296; 333/32, 133
See application file for complete search history.

(56) References Cited

U.S. PATENT DOCUMENTS

| | | | |
|---|---|---|---|
| 3,199,028 A * | 8/1965 | McLin et al. ................. 455/113 |
| 3,235,805 A * | 2/1966 | Hings ........................... 455/274 |
| 4,670,360 A | 6/1987 | Habermann et al. |
| 5,671,114 A | 9/1997 | Däumer et al. |
| 5,790,000 A | 8/1998 | Dai et al. |
| 5,892,648 A | 4/1999 | Bobert et al. |
| 5,912,596 A * | 6/1999 | Ghoshal ................... 331/117 R |
| 5,995,355 A | 11/1999 | Daeumer |
| 5,999,829 A * | 12/1999 | Chun et al. .................... 455/572 |
| 6,091,966 A * | 7/2000 | Meadows ................... 455/553.1 |
| 6,326,724 B1 | 12/2001 | Däumer et al. |
| 6,356,155 B1 * | 3/2002 | Judkins ......................... 330/295 |
| 6,366,788 B1 * | 4/2002 | Fujioka et al. ............. 455/553.1 |
| 6,529,361 B1 | 3/2003 | Petschel et al. |
| 6,658,265 B1 * | 12/2003 | Steel et al. ................. 455/553.1 |
| 6,753,734 B2 * | 6/2004 | Arell et al. ..................... 330/296 |
| 6,998,938 B2 | 2/2006 | Lin et al. |
| 7,098,737 B2 * | 8/2006 | Fujimoto et al. .............. 330/283 |
| 7,113,054 B2 * | 9/2006 | Riondet et al. .................. 333/32 |
| 2003/0048138 A1 * | 3/2003 | Van De Westerlo et al. . 330/311 |
| 2003/0214368 A1 * | 11/2003 | Taniguchi ..................... 333/133 |

(Continued)

FOREIGN PATENT DOCUMENTS

CN    1298563 A    6/2001
DE    198 14 631 A1    9/1999

(Continued)

OTHER PUBLICATIONS

Andrews, J.R.,"Broadband Coaxial Bias Tees," Application Note AN-1e, Nov. 2000, pp. 1-3, Picosecond Pulse Labs, Boulder, CO.

(Continued)

*Primary Examiner* — Yuwen Pan
*Assistant Examiner* — Fatuma Sherif
(74) *Attorney, Agent, or Firm* — Slater Matsil, LLP

(57) ABSTRACT

An HF-line includes parallel branches with bias terminals, to which a direct voltage source is respectively connected via a first inductor and a second inductor. The inductors are inductively coupled to one another.

7 Claims, 2 Drawing Sheets

(56) References Cited

U.S. PATENT DOCUMENTS

| | | | |
|---|---|---|---|
| 2004/0127185 A1* | 7/2004 | Abrahams et al. | 455/277.1 |
| 2004/0240420 A1* | 12/2004 | Nakai | 370/342 |
| 2005/0026647 A1* | 2/2005 | Li et al. | 455/552.1 |
| 2005/0062533 A1* | 3/2005 | Vice | H03F 3/45381 330/252 |
| 2006/0209485 A1 | 9/2006 | Imai et al. | |
| 2008/0136516 A1* | 6/2008 | Afsahi | 330/148 |
| 2009/0130999 A1* | 5/2009 | Chen et al. | 455/129 |
| 2009/0136516 A1* | 5/2009 | Tedder et al. | 424/153.1 |

FOREIGN PATENT DOCUMENTS

| | | |
|---|---|---|
| EP | 1 612 899 A1 | 9/1999 |
| JP | 2003-007420 | 1/2003 |
| WO | WO 2004/091060 A1 | 10/2004 |

OTHER PUBLICATIONS

Tao, R., et al., "Low Power 10 Gbit/s VCSEL driver for optical interconnect," Electronics Letters, vol. 39, No. 24, Nov. 27, 2003, 2 pages.

* cited by examiner

BIAS NETWORK

This application claims priority to German Patent Application 10 2008 044 845.1, which was filed Aug. 28, 2008 and is incorporated herein by reference.

TECHNICAL FIELD

The present invention pertains to a circuit for feeding a direct voltage into an HF-line.

BACKGROUND

In modern transceiver circuits for use in mobile telephones, particularly in the bands for GSM and UMTS, it is frequently required to supply the output mixer stage of the HF-line of the transceiver ("open collector" or "open drain") with a direct voltage externally via the HF-output pin. A so-called bias network provided for this purpose feeds the open-collector or open-drain output stages of the transceiver. This bias network should be integrated into a TX filter module. In order to maintain the size of the module as small as possible and thusly remain competitive, the normally used circuit technology cannot be employed in this case.

In order to feed a direct voltage into an HF-line, it is common practice to utilize a Bias-T connector element as described, for example, by James R. Andrews, entitled "Broadband Coaxial Bias Tees" (Picosecond Pulse Labs, Application Note AN-1e, Revision 1, Copyright November, 2000, http://picosecond.com/objects/AN-01e.pdf). The direct voltage is fed into the central conductor of a coaxial cable via a resistor or an inductor. In this case, the resistance should be significantly higher than the impedance of the HF-line in order to prevent a load on the HF-line. At a higher power demand, the direct voltage is coupled into the HF-line via an inductor in order to prevent a voltage drop from occurring at a resistor.

If the bias network is used in a TX (transmission) filter module, the module is preferably arranged on an LTCC substrate (low-temperature cofired ceramics), and the circuit of the bias network should be integrated into the LTCC substrate. When using a coil as an inductor for connecting the direct voltage, relatively high inductance values are required for achieving a sufficient decoupling of the direct voltage supply line from the HF-line. This complicates the integration of the inductor into the LTCC substrate if predetermined maximum dimensions of the TX filter module need to be observed.

SUMMARY

The present invention discloses a bias network for use in a TX module and that can be integrated into an LTCC substrate.

In the bias network, the HF-line features two parallel branches that are respectively provided with a bias terminal. The direct voltage is respectively fed into the corresponding branch via an inductor, wherein the two inductors are inductively coupled to one another. The total inductance required is significantly reduced due to the inductive coupling of the inductors. The thusly achieved reduction of the space requirement for these components makes it possible to integrate the inductors into the LTCC substrate in the form of coils without exceeding the predetermined dimensions of the substrate. If a coupling of 100% is achieved, the required inductance is reduced by 50% in comparison with an embodiment in which the inductors are not coupled. The outputs of the two branches of the HF-line can be combined into a single output (single-ended output) by means of a filter, particularly a surface wave filter. The inputs of the two branches of the HF-line can be connected to a mixer output of a transceiver IC as a symmetric input. Several of these bias networks can be used for different frequency bands of the same TX module.

BRIEF DESCRIPTION OF THE DRAWINGS

Examples of the bias network are described in greater detail below with reference to the enclosed figures.

Figure 1:
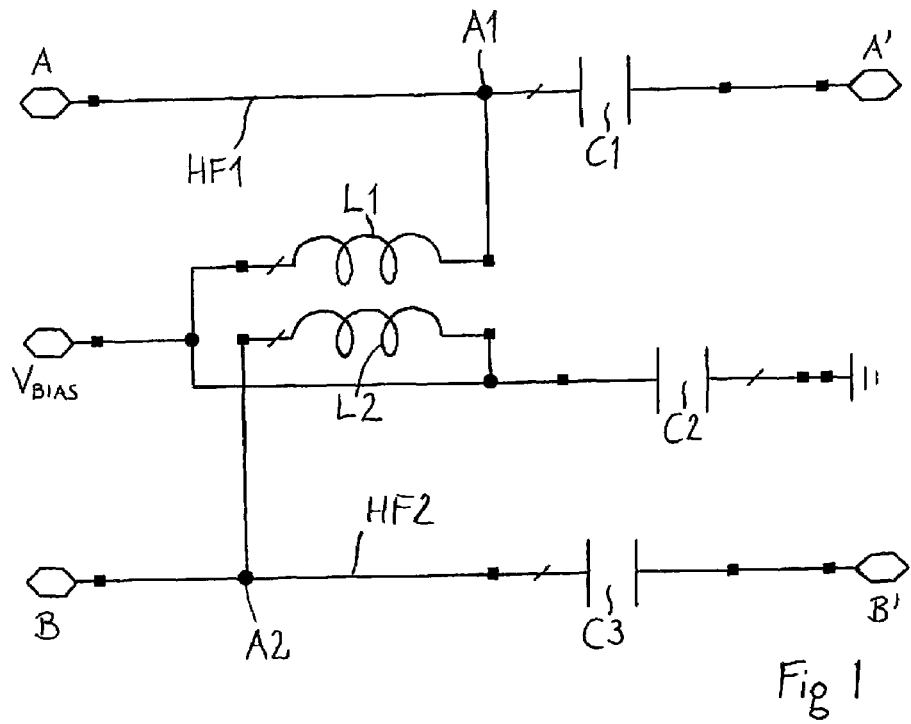
FIG. 1 shows a circuit diagram of one exemplary embodiment of the bias network.

The following list of reference symbols may be used in conjunction with the drawings:
11 First DC supply circuit
12 Second DC supply circuit
13 Third DC supply circuit
21 First filter
22 Second filter
23 Third filter
31 First adapter
32 Second adapter
33 Third adapter
41 First input pair
42 Second input pair
43 Third input pair
51 First output
52 Second output
53 Third output
61 First direct voltage source
62 Second direct voltage source
63 Third direct voltage source
A Input of first branch
A' Output of first branch
A1 Bias terminal of first branch
A2 Bias terminal of second branch
B Input of second branch
B' Output of second branch
C1 First capacitor
C2 Second capacitor
C3 Third capacitor
F Filter
HF1 First branch of HF-line
HF2 Second branch of HF-line
L1 First inductor
L2 Second inductor
OUT Output
S LTCC substrate
TX TX module
$V_{BIAS}$ Direct voltage source

DETAILED DESCRIPTION OF ILLUSTRATIVE EMBODIMENTS

FIG. 1 shows a circuit diagram of one exemplary embodiment of the bias network with coupled inductors. The HF-line comprises a first branch HF1 with an input A, an output A' and a bias terminal A1 and a second branch HF2 that lies parallel to the first branch and has an input B, an output B' and a bias terminal A2. The direct voltage is fed from a direct voltage source $V_{BIAS}$ into the branches of the HF-line via the inductors L1, L2. The direct voltage can be fed, in particular, to a transceiver connected to the input side in this fashion. In this embodiment, capacitors C1, C3 are provided for separating the direct voltage at the outputs A', B'. The capacitor C2 is preferably provided for short-circuiting the high frequency referred to the ground and thusly separating the direct voltage and the alternating voltage in the circuit. The inductors L1, L2 are inductively coupled to one another such that the inductances only need to have low values in comparison with conventional circuits used for feeding a direct voltage into an HF-line. This makes it possible to use circuit components with relatively small dimensions.

Figure 2:
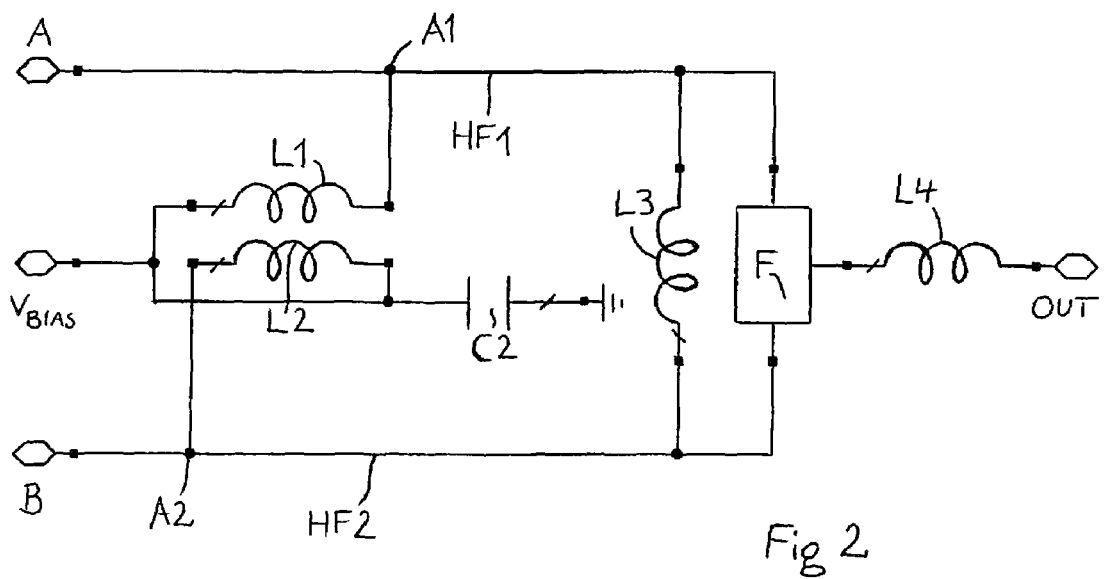
FIG. 2 shows a circuit diagram of another exemplary embodiment of the bias network.

FIG. 2 shows a circuit diagram of another exemplary embodiment of the bias network, in which the capacitors C1, C3 in the branches of the HF-line are replaced with a filter F. The filter F may comprise a surface wave filter. The inductors L3 and L4 respectively serve for adapting the impedances between a component connected to the inputs such as, for example, a transceiver and the filter F or between the filter F and a component connected to the output OUT such as, for example, a power amplifier. In this exemplary embodiment, the outputs A', B' of the branches HF1, HF2 of the HF-line are combined into a single output OUT (single-ended output) by means of the filter F. Both described exemplary embodiments make it possible to supply the mixer end stage of a transceiver IC connected to the input side with an external direct voltage ($V_{BIAS}$).

Figure 3:
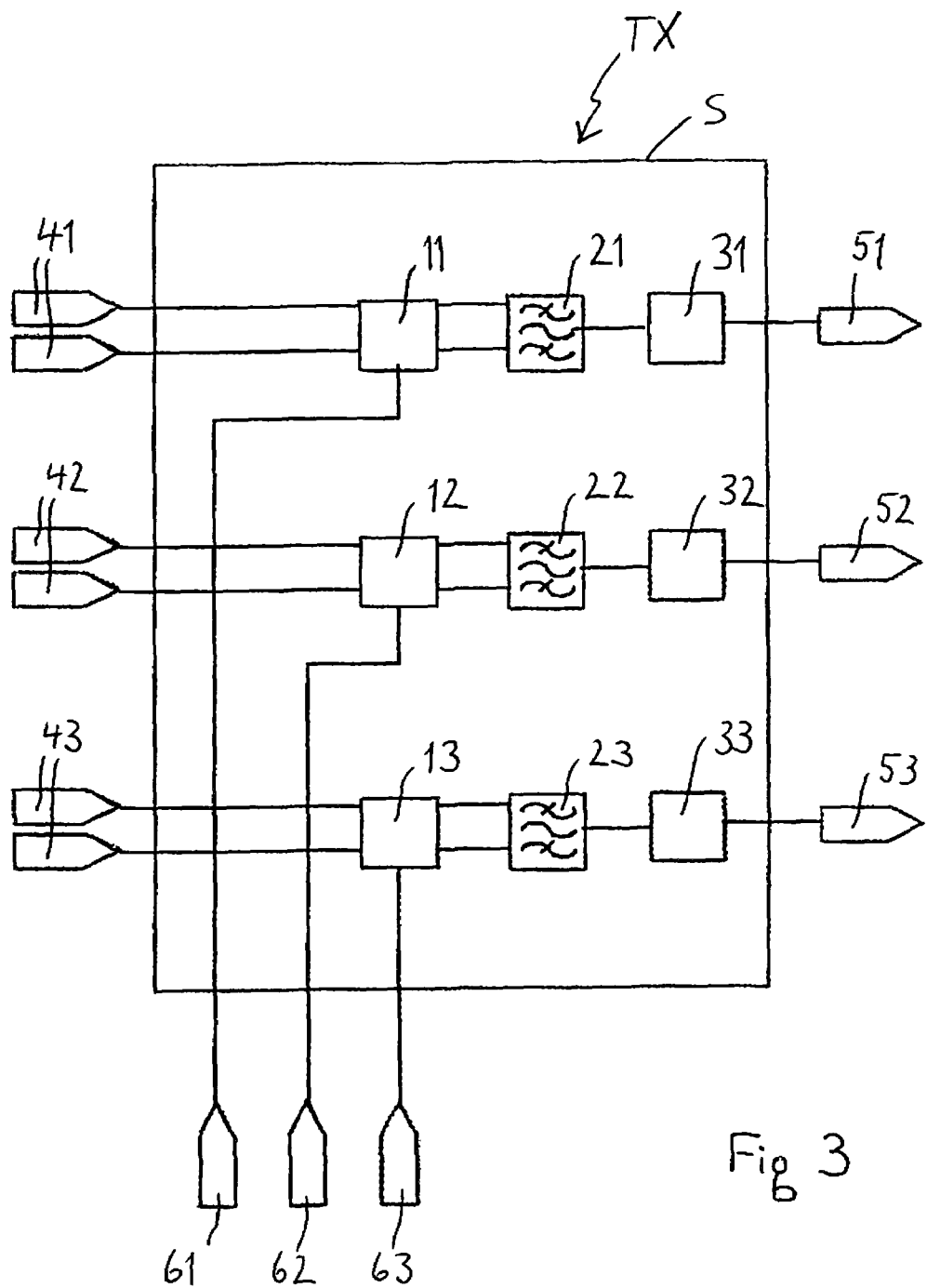
FIG. 3 shows a schematic circuit diagram of a TX module comprising bias networks.

A TX module realized with the bias network may be designed for more than one frequency band. Such an example is illustrated in the circuit diagram according to FIG. 3. The TX module TX may be integrated, for example, on an LTCC substrate S as indicated by the frame illustrated in the circuit diagram according to FIG. 3. The exemplary TX module is designed for three different frequency bands. One bias network is provided for each band. The bias networks respectively comprise a pair of symmetric inputs 41, 42, 43, a DC supply circuit 11, 12, 13, a filter 21, 22, 23, an adapter 31, 32, 33, an output 51, 52, 53 and a direct voltage source 61, 62, 63. The DC supply circuit 11, 12, 13 respectively comprises, for example, a partial circuit of the circuit illustrated in FIG. 2 and comprises the components L1, L2 and C2. Each of the direct voltage sources 61, 62, 63 corresponds to the direct voltage source $V_{BIAS}$ of the circuit according to FIG. 2, wherein several direct voltage sources may be provided for different values of the direct voltage. The input pairs 41, 42, 43 respectively correspond to the pair of inputs A, B in the exemplary embodiment according to FIG. 2. The filters 21, 22, 23 respectively comprise, for example, the inductor L3 and the filter F of the circuit according to FIG. 2. The separation of the direct voltage from the outputs 51, 52, 53 can be realized by using filters 21, 22, 23 in the form of surface wave filters. The adapter 31, 32, 33 may be respectively realized in the form of an inductor L4 according to the circuit shown in FIG. 2. The number of bias networks in the TX module is basically arbitrary. Consequently, several transceivers can be connected and respectively supplied with a direct voltage that is adapted to the corresponding frequency band.

What is claimed is:

1. A module comprising:
    a TX module comprising a LTCC (low temperature co-fired ceramic) substrate; and
    a plurality of bias networks integrated in the LTCC substrate, each of the bias networks comprising:
        a direct voltage source node;
        a first branch with a first bias terminal and a first output;
        a second branch with a second bias terminal and a second output, wherein the second branch lies in parallel to the first branch;
        a first inductor comprising a first coil integrated in the LTCC substrate;
        a second inductor comprising a second coil integrated in the LTCC substrate, wherein the second inductor is inductively coupled to the first inductor, predetermined dimensions of the LTCC substrate not being exceeded by an integration of the first and second coils;
    a first connection between the direct voltage source node and the first bias terminal of the first branch via the first inductor;
    a second connection between the direct voltage source node and the second bias terminal of the second branch via the second inductor;
    a single output, the first and second outputs being connected to the single output via a filter; and
    at least one further inductor, the first output and the second output being connected via the at least one further inductor to one another and in parallel to the filter, the bias networks being used for different frequency bands of the TX module.

2. The module according to claim 1, wherein the first output and the second output of each of the bias networks are combined by a surface wave filter.

3. The module according to claim 1, further comprising at least one second further inductor, wherein a surface wave filter is connected to the single output via the at least one second further inductor.

4. The module according to claim 1, further comprising each of the bias networks comprising a second further inductor, the first output and the second output of each of the bias networks being connected to one another via the second further inductor.

5. The module according to claim 1, wherein the first output and the second output of each of the bias networks are connected to the single output via the at least one further inductor.

6. The module according to claim 1, wherein the first output and the second output of each of the bias networks are connected to the single output via the at least one further inductor.

7. The module according to claim 5, further comprising each of the bias networks comprising a second further inductor, the first output and the second output of each of the bias networks being connected to one another via the second further inductor.

* * * * *